United States Patent

[11] 3,566,215

[72] Inventor Walter Heywang
Neukeferloh, Germany
[21] Appl. No. 749,180
[22] Filed July 31, 1968
[45] Patented Feb. 23, 1971
[73] Assignee Siemens Aktiengesellschaft
Berlin, Munich, Germany
[32] Priority Aug. 4, 1967
[33] Germany
[31] S111192

[54] TENSIONED SEMICONDUCTOR COMPONENT
4 Claims, 3 Drawing Figs.

[52] U.S. Cl. 317/235, 317/234, 250/211, 313/108, 331/94.5
[51] Int. Cl. H01l 15/00, H01l 7/38
[50] Field of Search 317/234, 10, 235, 27, 42; 331/94.5; 250/211 (J); 313/108

[56] References Cited
UNITED STATES PATENTS

| | | | |
|---|---|---|---|
| 3,309,553 | 3/1967 | Kruemer | 313/108 |
| 3,419,742 | 12/1968 | Herzog | 313/108 |
| 3,436,679 | 4/1969 | Fenner | 331/94.5 |
| 3,439,236 | 4/1969 | Blicher | 317/235 |

OTHER REFERENCES

LSA DIODES: New Source of Microwave Power— June 1967

*Primary Examiner*—John W. Huckert
*Assistant Examiner*—B. Estrin
*Attorneys*—Curt M. Avery, Arthur E. Wilfond, Herbert L. Lerner and Daniel J. Tick

ABSTRACT: The present invention relates to a semiconductor component particularly a semiconductor component with a PN junction whose characteristic electrical property is improved by mechanical tensioning of its semiconductor body. In accordance with the invention, the monocrystalline semiconductor body of the semiconductor component, produced by epitaxy upon a foreign substrate at elevated temperature, is so arranged on the substrate that at operating temperature its characteristic quality will be improved in contrast to an otherwise equal semiconductor component, which is precipitated upon a substrate of the same monocrystalline semiconductor material, due to a different thermal contraction of the substrate, compared to the semiconductor and the resulting tensioning of the semiconductor.

TENSIONED SEMICONDUCTOR COMPONENT

Figure 1:
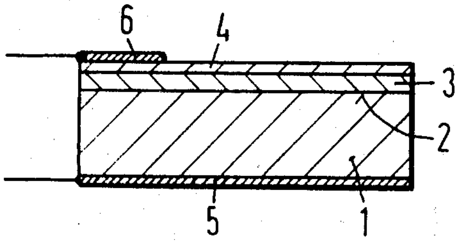

The present invention starts from the state of the art disclosed in "Solid State Electronics" 1961, Vol. 3, pages 261—267 or in the German Published Document 1,232,270. It is known from these publications, that the mobility of the current carriers in germanium, silicon and other semiconductors may be changed through elastic tensioning by about 50 percent and more. The changes in said mobility may be positive or negative and may be produced in the crystal in selected directions. Hence, this may compensate for or improve temperature changes, with respect to certain electrical properties of semiconductor devices with PN junctions, for example transistors, varactor diodes, tunnel diodes, solar elements and thermionic devices. Additional details can be seen in the aforementioned references.

In these techniques, the semiconductor device was placed into some apparatus which produces the mechanical tension. This method, however, entails certain disadvantages, since it cannot provide, in a truly simple way, reproducible forces and conditions. It is an object of the invention to effect an improvement in this respect.

The present invention relates to a semiconductor component particularly a semiconductor component with a PN junction whose characteristic electrical property is improved by mechanical tensioning of its semiconductor body. In accordance with the invention, the monocrystalline semiconductor body of the semiconductor component, produced by epitaxy upon a foreign substrate at elevated temperature, is so arranged on the substrate that at operating temperature its characteristic quality will be improved in contrast to an otherwise equal semiconductor component, which is precipitated upon a substrate of the same monocrystalline semiconductor material, due to a variable thermal contraction of the substrate, compared to the semiconductor and the resulting tensioning of the semiconductor.

During epitactic precipitation of semiconductor material, especially from a gaseous phase, high temperatures are known to be used in order for the precipitated semiconductor to grow monocrystalline material on the substrate. By epitaxy as used herein, I always mean monocrystalline precipitation of semiconductor material.

While the epitactic layer and the substrate body will contract in the same manner while cooling at normal temperatures, provided the epitactic layer and the substrate used are of the same material, this equalized contraction will not occur when a substrate of a foreign substance is used. As a result, mechanical tensions occur both in the substrate and in the epitactic semiconductor layer. When the thickness of the substrate body is considerably larger than the epitactic layer, the tensions will appear primarily in the epitactic semiconductor layer. These tensions are usually present at any operational temperature which may be suitable for the respective semiconductor devices. The fact that the operational temperatures of semiconductor devices are very low, as compared to the production temperature of the epitactic layer, and that large fluctuations of operational temperatures are generally avoided, results through use of the present invention to practically constant qualities in devices so produced.

It is important in the present invention to adjust the epitactic layer and the substrate to each other so that the tensioning caused by the action of the substrate upon the epitactic layer, produces a remarkable improvement of the characteristic quality of a specific semiconductor component. The "characteristic quality" is that quality which is preferably utilized during the operation of the respective semiconductor component. For example, in a diode, this is the directional characteristic, in a transistor this is the amplification quality, in a photo element this is the photo voltage etc. Of interest also is the reduction of the threshold current of gallium arsenide-laser diodes which is characteristic of luminescence diodes, and the initial field intensity of the Gunn effect in Gunn diodes. For a number of other semiconductor components, for example transistors and diodes, the life span of the carriers as well as the mobility of charge carriers in a desired flow direction is important. Thus, for example, in a laser diode a ray emission in the plane of the epitactic layer, caused by the band distortion, due to mechanical action, is preferred while in a luminescence diode, on the other hand, a ray emission is preferred in perpendicular relation thereto. Correspondingly, in a gallium-arsenide luminescence diode with a PN junction, a smaller expansion coefficient of the substrate is desired in the (111) planes than is shown by the semiconductor material. On the other hand, it is recommended, during the production of a Gunn diode of gallium arsenide, to lower the (100) minimum in the *k*-space, preferably positioned in flow direction, so that the desired tension condition results directly from the geometry of the diode.

Figure 2:
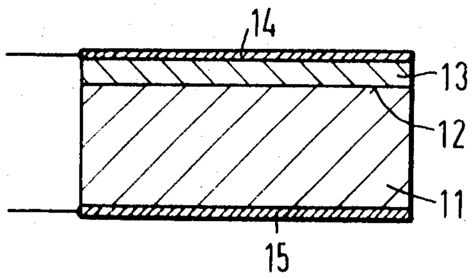

The following examples will describe several preferred embodiments of the present invention with respect to the drawing which shows, prepared in accordance with my invention, in:

FIG. 1, a gallium arsenide or indium arsenide laser diode;

FIG. 2, a Gunn diode; and

Figure 3:
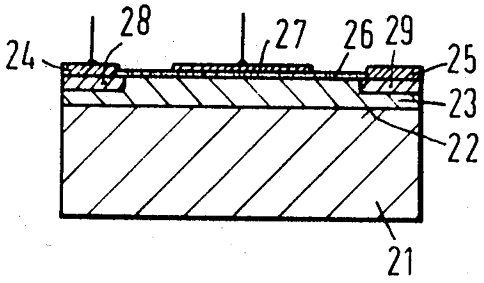

FIG. 3, a field effect transistor.

EXAMPLE 1. GALLIUM ARSENIDE OR INDIUM ARSENIDE LASER DIODE

In a laser diode of FIG. 1, the substrate 1 consists of monocrystalline silicon with a prepared (111) surface 2 upon which a layer 3 of monocrystalline gallium arsenide or indium arsenide, thin in comparison to the thickness of the substrate body 1, is applied. The (111) planes of this monocrystalline layer 3 are parallel to the substrate surface 2. The PN junction 4, which characterizes the laser diode is also parallel to the substrate surface 2 and thus to the (111) surfaces. The conductivity of the substrate 1 and of the layers 4, separated by the PN junction is so adjusted to each other that the substrate serves for contacting the adjacent semiconductor region. The substrate 1 is comprised, for example, of *n*-conducting silicon, the adjacent region 3 of *n*-conducting gallium arsenide, while the upper portion 4 of the epitactic layer shows *p*-conductivity. Electrode 5 contacts the substrate, and electrode 6 contacts the uppermost layer. The doping of laser diodes is known per se. For example, the *p*-conducting region may have a concentration of acceptor atoms, such as zinc or cadmium of 2 $10^{19}$ to 2 $10^{20}$ atoms/ $cm^3$ and the *n*-conducting regions a donor concentration, such as sulfur, selenium or tellurium of $10^{18}$ to $10^{19}$ atoms/$cm^3$. A temperature of b 1000° C, preferably 1400° C, is used to produce the epitactic layer. A monocrystalline precipitation of gallium arsenide is quite feasible on an appropriately undisturbed substrate surface from, for example, an atmosphere of gallium subchlorides, used in admixture with pure hydrogen or an inert gas, for example argon or helium, in addition to gaseous doping materials. The epitactic layer has a total thickness amounting to a maximum one-tenth of the thickness of the substrate body. In such an arrangement, a mechanical tension prevails both in the plane of the PN junction 4 and perpendicular thereto, i.e. perpendicular to the substrate surface 2. Using the above indicated dimensioning of the layer thickness, a notable tension is established in the epitactic layer at conventionally used operational temperatures for gallium arsenide or indium arsenide diodes, resulting in an improvement of up to 30 to 40 percent of the initial field intensity, compared to the otherwise similar Laser diodes which were precipitated, however, on a substrate of gallium arsenide or indium antimonide.

EXAMPLE 2. GALLIUM ARSENIDE LUMINESCENCE DIODE diode

The arrangement shown in FIG. 1 can be used directly. The only difference between the luminescence diode and the laser diode discussed in Example 1, is that the doping in the luminescence diode, contrary to the laser diode, is not effected through degeneration of either the *p*- or *n*- region of the epitactic layer. A known degenerate doping is effected in the laser diode, which is obvious from Example 1 pertaining to the laser diode. In the instant example, the substrate also serves for contacting purposes, making permissible the use of a substrate 1, comprised of degeneratively doped silicon, although not required.

In a luminescence diode according to FIG. 1 it is preferable to use a doping concentration of approximately $10^{17}$ to $10^{18}$ atoms/cm$^3$ for the *n*-region and approximately b $10^{18}$ to $10^{19}$ atoms/cm$^3$ for the *p*-region. The dopant materials may be the same as in Example 1.

EXAMPLE 3. GUNN DIODE

In this example, a substrate comprised of monocrystalline silicon may be used. A semiconductor layer of monocrystalline gallium arsenide and/or indium phosphide is precipitated to form the semiconductor body of a Gunn diode. If a field intensity of more than $3 \cdot 10^3$ V/cm is produced in the semiconductor layer, current instabilities occur in the semiconductor, which lead to the occurrence of microwaves (Gunn effect). The field intensity at which the Gunn effect sets in depends on the pressure.

FIG. 2 shows an example of a Gunn diode. The substrate 11 is comprised of monocrystalline *n*-conducting silicon and carries at its upper side 12, oriented in (100)-direction, a semiconductor layer 13 of the same conductance type of *n*-conducting gallium arsenide or indium phosphide. The doping of the semiconductor layer 13 of gallium arsenide or indium phosphide is dependent, in a known manner, on the geometrical dimensions or on the desired oscillating frequency. Layer 13 is contacted at its upper surface with a silicon layer or a thin metal electrode 14, e.g. in the form of metallization while the substrate 11 is contacted with electrode 15. Either the electrode 14 does not produce a notable mechanical tension in the semiconductor layer or the metal for the metal electrode 14 is so selected that it acts, with respect to the tension state, in the same sense as the substrate body 11, upon the below-lying semiconductor layer 14. In a silicon electrode this is automatically so. Tin or indium may also serve, for example, as contact material 14.

EXAMPLE 4. FIELD EFFECT TRANSISTOR

Field effect transistors or switching transistors serve as examples of semiconductor devices, for which an increased mobility of the charge carriers is of importance. Such an arrangement is shown in FIG. 3. A layer 23 comprised of monocrystalline *p*-conducting silicon is precipitated by the epitactic method upon a (111) surface 22 of a monocrystalline substrate 21 which crystallizes according to the Spinell type. Layer 23 is homogeneously doped. The growth direction of said layer takes place in the (111) direction, so that the layer surface on the border to the substrate also coincides with a (111) surface. The precipitation temperature is preferably between 1000 and 1400° C. The doping of the epitactic layer is, for example, $10^{16}$ dopant atoms/cm$^3$. Electrodes 24 and 25 are provided at the ends of layer 23, and serve respectively as a source and a drain. An oxide layer 26 was applied in a known manner to layer 23. The surface of the oxide layer 26 carries a control electrode 27, insulated against the semiconductor 23. The oxide layer 26 may also be replaced by a silicon nitride layer. Source and drain may be provided in a known manner with injectable PN junctions. To this end, we use *n*-conducting regions 28, 29 which are contacted in barrier-free relation with electrodes 24 or 25. An increase in carrier mobility is obtained in the semiconductor layer 23, in the direction between source and drain.

If a reduction of carrier mobility instead is desired, then the surface 22 of the (100) plane and the layer 23 are made *n*-conductive. The materials remain unchanged.

Should the use of thicker semiconductor layers be desirable in the above-indicated or in similar devices, as may be the case for production purposes, it may be preferred, sometimes, to effect a renewed precipitation of the substrate body at the side lying opposite to said substrate, so as to effect a mechanical support of the substrate body.

The mechanical tension effected by the substrate on the semiconductor layer may be approximately determined by the following formula: $\pi = \Delta\alpha \cdot \Delta T \cdot E$ $\pi$ denotes the mechanical tensions, $\Delta\alpha$ the difference of the thermal expansion coefficients, $\alpha$ T the difference between epitactic application temperature and normal or operating temperature and E is the elasticity modulus of the epitactic semiconductor layer. The formula applies when the thickness of the epitactic layer is not more than one-tenth of the substrate layer. The following is found in connection with the laser diode, indicated in Example 1:

$\Delta\alpha = 3 \cdot 10^{-6}$ /° C (gallium arsenide on silicon)
$E = 1 \cdot 10^6$ kpond/cm$^2$
$\Delta T = 1000°$ C (when the precipitation temperature is approximately 1000° C) 1 This results in a tension $\pi$ of 3000kp/cm$^2$. Through this tension, the threshold current of the laser diode is reduced to about 40 percent.

The number of examples may be further increased. More particularly, a transistor may also be produced in the epitactic layer. Thereby the substrate is preferably so oriented with respect to the two PN junctions of the transistor, that the tensioning produces an acceleration of the minority charge carriers in the base region. FIG. 3 is apropos. The PN junctions are thereby oriented perpendicularly to the direction of the current and, hence, to the substrate surface. The substrate corresponds to conditions disclosed in Example 4.

I claim:

1. A light generating semiconductor diode comprising a silicon monocrystal and a relative thinner monocrystalline layer of gallium arsenide or indium arsenide epitaxially precipitated upon said crystal at elevated temperatures to form a hetero junction therewith wherein said junction and said layer are parallel with a (III) surface of the silicon lattice, an active light emitting PN junction located within the said thinner monocrystalline layer and parallel to said hetero junction and one region of said layer being contacted by the silicon monocrystal to form the hetero junction and being of the same conductivity type as the monocrystal and another region of said layer being of opposite conductivity type and contacting an electrode on a surface opposite to the silicon monocrystal.

2. The semiconductor diode of claim 1, wherein the silicon monocrystal is *n*-conductivity type and its adjacent one region of *n*-conductivity gallium arsenide or indium arsenide region is doped at a donor concentration of $10^{18}$ to $10^{19}$ atoms/cm$^3$ while the *p*-conductivity gallium arsenide or indium arsenide region situated at the other side of the PN junction, is doped with 2 $10^{19}$ to 2 $10^{20}$ acceptor atoms/cm$^3$.

3. The semiconductor diode of claim 1, wherein the *n*-region of the diode is doped to $10^{17}$ to $10^{18}$ donor atoms/cm$^3$ and the *p*-region is doped to $10^{18}$ to $10^{19}$ atoms/cm$^3$.

4. The semiconductor diode of claim 1, wherein the thinner monocrystalline layer is, at the most, one-tenth the thickness of the silicon crystal.